United States Patent [19]

Maszara et al.

[11] Patent Number: 5,073,506

[45] Date of Patent: Dec. 17, 1991

[54] METHOD FOR MAKING A SELF-ALIGNED LATERAL BIPOLAR SOI TRANSISTOR

[75] Inventors: Witold P. Maszara, Columbia; Anthony L. Caviglia, Lourel, both of Md.

[73] Assignee: Allied-Signal Inc., Morris Township, Morris County, N.J.

[21] Appl. No.: 655,477

[22] Filed: Feb. 14, 1991

[51] Int. Cl.$^5$ .................. H01L 21/265; H01L 21/86; H01L 29/73

[52] U.S. Cl. ........................... 437/21; 148/DIG. 10; 148/DIG. 96; 148/DIG. 150; 357/35; 437/32

[58] Field of Search ............ 437/32; 148/DIG. 150, 148/DIG. 10, DIG. 11, DIG. 96

[56] References Cited

U.S. PATENT DOCUMENTS

| | | | |
|---|---|---|---|
| 4,545,113 | 10/1985 | Vora | 437/21 |
| 4,553,316 | 11/1985 | Houston et al. | 437/29 |
| 4,792,837 | 12/1988 | Zazzu | 357/35 |
| 4,965,872 | 10/1990 | Vasudev | 357/35 |

OTHER PUBLICATIONS

"High Performance Lateral Bipolar Transistor on Insulating Substrate", IBM Technical Disclosure Bulletin, Ning et al., vol. 26, No. 11, Apr. 1984.

Primary Examiner—Olik Chaudhuri
Assistant Examiner—Long Pham
Attorney, Agent, or Firm—Howard G. Massung; Christopher Malvone; Robert A. Walsh

[57] ABSTRACT

A method for making a lateral bipolar transistor using SOI technology. A base mask is formed on the surface of a silicon island and its sidewalls coated with a layer of silicon dioxide. After local oxidization of the silicon island, emitter and collector regions are implanted using the base mask and the silicon dioxide deposited on the sidewalls of the base mask as a mask. The base mask is then removed and a shallow base contact region is implanted in the base region previously shielded by the base mask. The remaining silicon dioxide deposited on the sidewalls of the base mask form vertical spacers which are used as a self-aligned mask for forming silicide contacts on the emitter, collector and base contact regions. These remaining silicon dioxide vertical spacers physically separate emitter-base and base collector junctions from the highly doped base contact area and electrically isolate the silicide contacts.

9 Claims, 1 Drawing Sheet 5,073,506

METHOD FOR MAKING A SELF-ALIGNED LATERAL BIPOLAR SOI TRANSISTOR

BACKGROUND OF THE INVENTION

1. Field of the Invention

The invention is related to a method for making bipolar transistors and, in particular, for making a self-aligned lateral bipolar transistor using silicon on insulator (SOI) technology.

2. Background of the Invention

Bipolar transistors in a lateral configuration are ideally suited for thin silicon on insulator (SOI) technology. These bipolar transistors have the potential for sharing fabrication steps with MOSFETS and related devices. The most advanced process for making such bipolar transistors has been proposed by J.C. Sturm et al in their article "A Lateral Silicon-on-Insulator Bipolar Transistor with a Self-Aligned Base Contact", IEEE Electron Device Letters, Vol. EDL-8, No. 3, Mar. 1987, pp. 104-106. The process disclosed by Sturm et al features a self-aligned contact to the base. Sturm's approach to the fabrication of the lateral bipolar transistor can also be used in bulk processing technology combined with any one of the standard isolation techniques. The process for making a lateral bipolar transistor taught by Sturm et al has the following steps:

1) Island formation (first mask step)
2) Base contact implant
3) Base mesa formation by partial removal of silicon (second mask step)
4) Emitter, collector implant which uses mask for base mesa formation
5) Oxide deposition and planarization
6) Partial removal of deposited oxide for base contact vias (third masking step)
7) Emitter, collector vias etch (fourth mask step)
8) Metal electrode deposition and etch (fifth mask step)

The process taught by Sturm et al requires a base mesa to be formed (step 3) in which the silicon island, outside the base region, is etched approximately halfway through by a vertical plasma etch. Alternate methods for making self-aligned lateral bipolar transistors in semi-conductor substrates are taught by Ogura et al in U.S. Pat. No. 4,641,170, D'Arrigo et al; in U.S. Pat. No. 4,669,177, Coello-Vera; in U.S. Pat. No. 4,586,965, Welbourn; in U.S. Pat. No. 4,801,556; and by Hingark in U.S. Pat. No. 4,298,402.

The invention is an improved method for making lateral bipolar transistor on an insulator substrate.

SUMMARY OF THE INVENTION

A method for making a lateral bipolar transistor in which a silicon island is formed on an insulating layer of a substrate. The method consists of the steps of forming a base mask on the surface of said silicon island. A layer of silicon dioxide is deposited over the base mask, its sidewalls, and the surface of the silicon island. The oxide is then reactive ion etched to remove the silicon dioxide from the top surfaces of the silicon island and the base mask, leaving the silicon dioxide deposited on the sidewalls of the base mask. The silicon island is then locally oxidized to form a thin oxide layer over the silicon island not masked by the base mask, and the silicon dioxide remaining on the sidewalls of the base mask. A dopant of a first conductivity type is implanted through the thin oxide layer into the silicon island to form an emitter and a collector region on opposite sides of the region shielded by the base mask and the silicon dioxide remaining on the sidewalls of the base mask. The base mask is then selectively removed to expose a base region on the silicon island surrounded by the remaining portion of the silicon dioxide deposited on the sidewalls of the base mask. This remaining portion of the silicon dioxide forms vertical spacers between the emitter-base regions and the base-collector regions. A shallow base contact region is then formed in the base region between the vertical spacers by implanting a second dopant of a second conductivity type. This implant does not enter the emitter and collector regions due to the locally grown oxide. After the removal of the oxidized layer covering the emitter and collector regions, silicide contacts are formed on the emitter, collector and base contact regions using the vertical spacers as a mask. Conductive metal electrodes are then applied which make independent electrical connection to each of the silicide contacts.

A first object of the invention is an improved method for making a lateral bipolar transistor having increased high frequency capabilities and decreased power consumption.

A second object of the invention is an improved method for making a lateral bipolar transistor having a significantly reduced failure rate.

Another object of the invention is a process for making a lateral bipolar transistor in which the number of masking steps are reduced.

Another object of the invention is a process in which vertical spacers are used to separate the emitter base and base-collector regions of the bipolar transistor.

These and other objects of the invention will become more apparent from reading the detailed description of the process in conjunction with the drawings.

DETAILED DESCRIPTION O HE INVENTION

The processing steps used in the fabrication of a fully self-aligned silicon on insulator (SOI) lateral bipolar transistor are shown in FIGS. 1-6.

Figure 1:
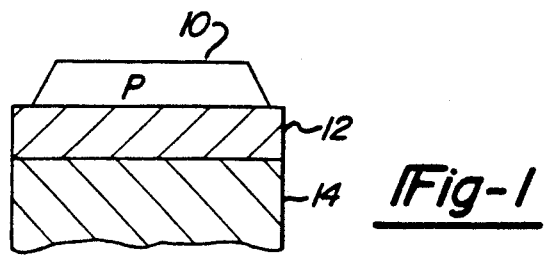
FIG. 1 is a cross-sectional view showing the starting structure of the transistor.

The starting material is a single crystal silicon film approximately 0.25 microns thick on an insulator, such as silicon dioxide, formed on a supporting substrate, such silicon island may be produced by any of the various techniques known in the art. As shown in FIG. 1, a single crystal silicon island 10 is formed on the surface of a silicon dioxide (SiO$_2$) insulating layer 12 by removing the unwanted silicon layer surrounding it. As shown, the silicon island 12 is doped to have a p-type conductivity.

Figure 2:
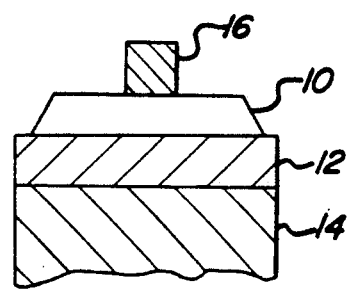
FIG. 2 is a cross-sectional view showing the addition of the base mask.

A nitride base mask 16 is formed in the central region of the silicon island 10, as shown in FIG. 2, by first depositing a nitride layer about 0.2 microns thick over the silicon island 10. A photoresist mask is then formed on top of the nitride layer to define the location of the base mask 16, and the excess portions of the nitride layer not protected by the photoresist mask is removed.

Figure 3:
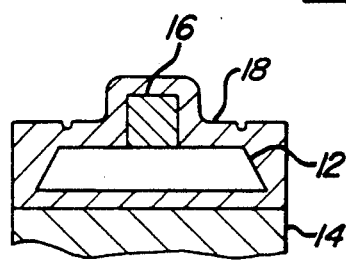
FIG. 3 is a cross-sectional view showing the addition of the deposited silicon dioxide layer from which the base mask is formed.
Figure 4:
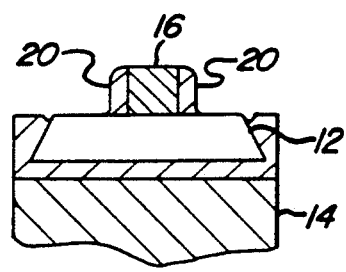
FIG. 4 is a cross-sectional view showing the structure remaining after the reactive ion etch.

The photoresist mask is then removed from the top surface of the base mask 16, and a layer of silicon dioxide 18 approximately 0.2 microns thick is deposited over the top of the silicon island 10 and the surrounding area, as shown in FIG. 3. A reactive ion etch is then used to remove the silicon dioxide layer 18 from the top surface of the base mask 16 and the top surface of the silicon island 10 surrounding the base mask 16. As shown in FIG. 4, due to the thickness of the silicon dioxide layer 18 on the sides of the nitride base mask 16 only a portion of the silicon dioxide layer deposited on the sides of the base mask is removed by the reactive ion etch and the remaining portions of the silicon dioxide layer form vertical spacers 20 along the sidewalls of the base mask 16. These vertical spacers 20 will be subsequently used to self-align the base contact implant and the emitter, and the collector implants, the silicide contacts, and to separate emitter-base and base-collector junctions from the highly doped base contact area as shall be explained later.

The region of the silicon island 10 not shielded by the vertical spacers 20 and the nitride base mask 16 is locally oxidized to form a thin silicon dioxide (LOCOS) layer 22 approximately 0.1 microns thick. This thickness of the silicon dioxide layer 22 is sufficient to mask the subsequent implantation of a shallow base contact.

Figure 5:
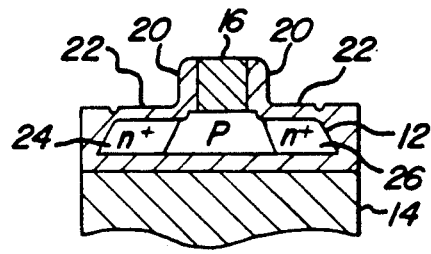
FIG. 5 is a cross-sectional view showing the formation of the emitter and collector regions.

A first dopant having a conductivity type opposite that of the silicon island such as arsenic (As) is implanted into the regions of the silicon island 10 on opposite sides of the base mask 16 to form n+emitter n+collector regions 24 and 26 respectively, separated by a p-type base region underlying the base mask 16 and the vertical spacers 20, as shown in FIG. 5.

Figure 6:
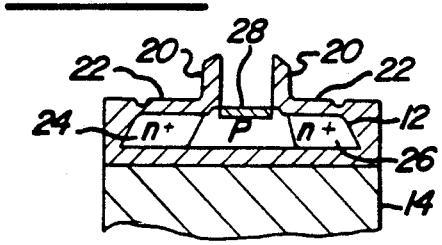
FIG. 6 is a cross-sectional view showing the implantation of the base contact region.

The concentration of the implanted arsenic ions in the emitter and collector regions are preferably in the range from $10^{19}$ to $10^{20}$ ions per cubic centimeter. A wet etch is then used to remove the base mask 16, as shown in FIG. 6, and the base region is implanted using a second dopant, such as boron, to form a shallow base contact region 28 in the area previously masked by the base mask 16. The concentration of the implanted boron ions in the base contact region is in the range from $10^{19}$–$10^{20}$ ions per cubic centimeter. As indicated above, the silicon dioxide (LOCOS) layer 22 has a thickness sufficient to protect the emitter and collector regions 24 and 26 during the implantation of the shallow base contact region 28.

Figure 7:
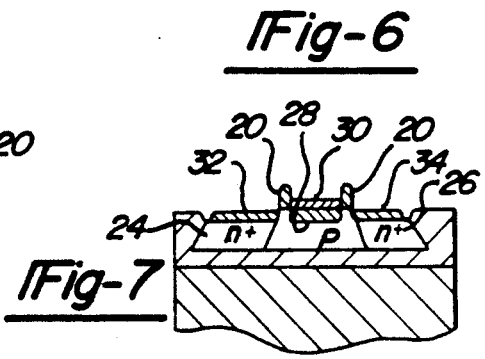
FIG. 7 is a cross-sectional view showing the application of the silicide electrical contacts using the vertical spacers as a mask.

The silicon dioxide (LOCOS) layer 22 over the emitter and collector regions, 24 and 26 respectively, is removed by a reactive ion etch. This reactive ion etch also removes a portion of the vertical spacers 20, however a sufficient portion of the vertical spacers 20 remain on the surface of the silicon island 10 to self-align emitter, collector and base contacts, as shown in FIG. 7. The use of the vertical spacers 20 to separate the emitter-base and base-collector junctions from the highly doped base contact is an alternative to the teachings of the prior art, which uses deep mesa cuts to minimize the undesired recombination at the base contact of the carriers injected by the emitter 24.

After the removal of the silicon dioxide layer 22, a layer of a refractory metal, such as cobalt, is deposited over the silicon island 10 and reacted with the silicon (Si) at approximately 700° C. to form a silicide contact 30 over the base contact region 28, a silicide contact 32 over the emitter region 24 and a silicide contact 34 over the collector region 26, as shown in FIG. 7. The unreacted refractory metal covering the silicon dioxide layer surrounding the silicon island 10 and the vertical spacers 20 are removed by a selective chemical etch as is known in the art.

Figure 8:
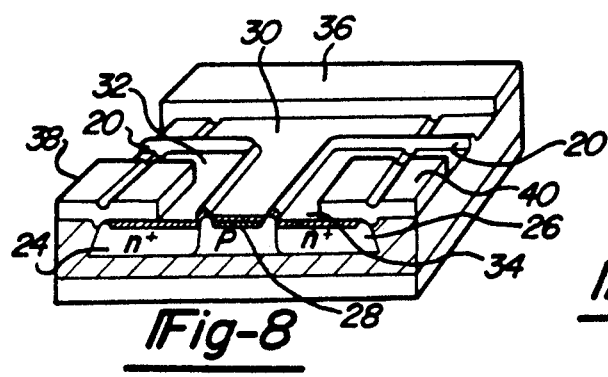
FIG. 8 is a perspective cross-sectional view showing the completed lateral bipolar transistor with metal electrodes included.

In the final step, metal electrodes 36, 38 and 40 are formed, as shown in FIG. 8. Metal electrode 36 is in electrical contact with silicide contact 30 over the base contact region 28, metal electrode 38 is in electrical contact with the silicide contact 32 over the emitter region 24, and metal electrode 40 is in electrical contact with the silicide contact 34 over the collector region 26 from a region outside the silicon island 10. The metal electrodes 36, 38 and 40 are formed by depositing a highly conductive metal such as gold, silver, or aluminum over the substrate. The location of the metal electrodes is then defined by photoresist masks, and the excess metal is etched away using any of the methods known in the art.

One advantage of the method described above is that it eliminates two (2) steps of the prior art processes, such as that taught by Sturm et al in the IEEE Electron Device Letters, Vol. EDL-8, No. 3, Mar. 1987, pp. 104–106, which are difficult to control. First, it eliminates the step of partially etching the silicon to form the base mesa, and secondly it removes the step of the partial removal of the silicon dioxide for base contact vias. The base mask 16 and the vertical spacers 20 provide for the self-alignment for emitter, collector and base implants and self-alignment for the formation of the silicide contacts to the emitter, collector and base contact regions of the bipolar transistor. The vertical spacers 20 also significantly reduce detrimental series resistance between adjacent silicide contacts. This contributes to the high frequency capability of the bipolar transistor and decreases its power consumption. Effectively, the method described above reduces the number of masking steps from five to three. The elimination of the two poorly controllable steps dicussed above results in a significant reduction of the risk of transistor failure.

It is not intended that the disclosed method for making a bipolar transistor be limited to the specific steps or sequence of steps discussed above and shown in the drawings. It is recognized that those skilled in the art will be capable of making changes and improvements to the disclosed method within the spirit of the invention as set forth in the claims.

We claim:

1. A method for making a lateral bipolar transistor using SOI technology comprising:
   forming a silicon island on an insulating substrate, said silicon island having a first conductivity type;
   forming a base mask on said silicon island, said base mask having a top surface and sidewalls;
   depositing a layer of silicon dioxide on said silicon island, said layer of silicon dioxide covering said top surface and said sidewalls of said base mask;

ion etching to remove said layer of silicon dioxide from the top surfaces of said silicon island and said base mask and to partially remove a portion of said layer of silicon dioxide deposited on said sidewall of said base mask to produce vertical side wall spacers;

locally oxidizing said silicon island to produce an oxide layer on said top surface of said silicon island not protected by said base mask and said vertical sidewall spacers;

implanting said regions of said silicon island not masked by said base mask and said vertical sidewall spacers through said oxide layer with a first dopant of a second conductivity type to form an emitter region and a collector region in said silicon island on opposite sides of said base mask;

removing said base mask by wet etching to uncover a base region;

implanting said base region with a second dopant of said first conductivity type to form a shallow base contact region, said oxide layer shielding said emitter and collector regions from being implanted by said second dopant;

ion etching to remove said oxide layer over said emitter and collector regions; and forming silicide contacts on said emitter, collector and base contact regions using said vertical sidewall spacers as a mask.

2. The method of claim 1 wherein said step of forming a base mask forms a nitride base mask.

3. The method of claim 1 wherein said step of forming a nitride base mask comprises the steps of:
depositing a layer of nitride on said silicon island;
applying a photoresist mask on said layer of nitride to define a base region;
ion etching to remove those portions of said layer of nitride not protected by said photoresist mask to form said base mask; and
removing said photoresist mask.

4. The method of claim 1 wherein said step of locally oxidizing said silicon island produces an oxide layer on said top surface of said silicon island approximately 0.1 microns thick.

5. The method of claim 1 wherein said step of implanting with said first dopant implants arsenic ions.

6. The method of claim 5 wherein the concentration of said first dopant in said emitter and collector regions is approximately $10^{19}$ to $10^{20}$ ions per cubic centimeter.

7. The method of claim 1 wherein said step of implanting with said second dopant implants boron.

8. The method of claim 7 wherein the concentration of aid second dopant in said base contact region is approximately $10^{19}$ to $10^{20}$ ions per cubic centimeter.

9. The method of claim 1 further including the step of depositing conductive metal electrodes independently connected to said aide silicide contacts on said emitter, collector and base contact regions.

* * * * *